United States Patent
Rieder et al.

(10) Patent No.: US 11,251,349 B2
(45) Date of Patent: Feb. 15, 2022

(54) TUBE LAMP WITH LEADFRAME

(71) Applicant: LEDVANCE GmbH, Garching bei Munchen (DE)

(72) Inventors: Bernhard Rieder, Regensburg (DE); Heinz Lang, Schernfeld (DE); Georg Rosenbauer, Wassertrüingen (DE)

(73) Assignee: LEDVANCE GMBH, Garching bei Munchen (DE)

( * ) Notice: Subject to any disclaimer, the term of this patent is extended or adjusted under 35 U.S.C. 154(b) by 0 days.

(21) Appl. No.: 16/232,281

(22) Filed: Dec. 26, 2018

(65) Prior Publication Data
US 2019/0195439 A1 Jun. 27, 2019

(30) Foreign Application Priority Data

Dec. 22, 2017 (DE) .......................... 102017131063.0
Jan. 19, 2018 (EP) ..................................... 18152566

(51) Int. Cl.
| | |
|---|---|
| H01L 33/62 | (2010.01) |
| F21K 9/278 | (2016.01) |
| F21V 29/503 | (2015.01) |
| F21V 23/00 | (2015.01) |
| F21V 19/00 | (2006.01) |
| H01L 25/075 | (2006.01) |
| F21K 9/27 | (2016.01) |

(Continued)

(52) U.S. Cl.
CPC ................ *H01L 33/62* (2013.01); *F21K 9/27* (2016.08); *F21K 9/278* (2016.08); *F21V 19/005* (2013.01); *F21V 23/006* (2013.01); *F21V 29/503* (2015.01); *H01L 21/4828* (2013.01); *H01L 21/4842* (2013.01); *H01L 25/0753* (2013.01); *F21K 9/232* (2016.08); *F21K 9/90* (2013.01); *F21V 23/005* (2013.01); *F21V 23/06* (2013.01); *F21Y 2103/10* (2016.08); *F21Y 2115/10* (2016.08); *H01L 33/647* (2013.01); *H01L 2933/0066* (2013.01); *H05K 3/202* (2013.01)

(58) Field of Classification Search
CPC .......... F21K 9/27; F21K 9/278; F21V 29/503
See application file for complete search history.

(56) References Cited

U.S. PATENT DOCUMENTS 3,836,317 A * 9/1974 Lukas ..................... C01B 17/64
431/361
4,701,002 A * 10/1987 Mouissie ............... H01R 12/79
439/426

(Continued)

FOREIGN PATENT DOCUMENTS

| DE | 102014214603 A1 | 1/2016 |
| DE | 102017103184 A1 | 8/2018 |

(Continued)

*Primary Examiner* — Bryon T Gyllstrom
*Assistant Examiner* — Christopher E Dunay
(74) *Attorney, Agent, or Firm* — Hayes Soloway PC

(57) ABSTRACT

A light fixture has a translucent tubular bulb. At least one end cap is located at one end of the translucent tubular bulb. A light engine is disposed in the translucent tubular bulb. The light engine has a leadframe on which a plurality of semiconductor light elements is arranged. The fixture may include an electronic driver. The electronic driver includes a plurality of electronic components. At least one of the plurality of electronic components is arranged inside the transparent tubular bulb.

23 Claims, 6 Drawing Sheets

(51) Int. Cl.
*H01L 21/48* (2006.01)
*F21Y 115/10* (2016.01)
*H01L 33/64* (2010.01)
*F21Y 103/10* (2016.01)
*F21V 23/06* (2006.01)
*H05K 3/20* (2006.01)
*F21K 9/90* (2016.01)
*F21K 9/232* (2016.01)

(56) References Cited

U.S. PATENT DOCUMENTS

| | | | | |
|---|---|---|---|---|
| 6,579,125 | B1* | 6/2003 | Nagahata | H01R 12/721 439/629 |
| 7,594,738 | B1* | 9/2009 | Lin | F21V 23/006 362/218 |
| 2004/0007980 | A1* | 1/2004 | Shibata | F21K 9/27 313/634 |
| 2004/0252501 | A1 | 12/2004 | Moriyama et al. | |
| 2008/0037245 | A1* | 2/2008 | Chan | F21K 9/278 362/218 |
| 2009/0026973 | A1* | 1/2009 | Kato | H05B 33/0803 315/201 |
| 2010/0002424 | A1* | 1/2010 | Lin | H05K 1/141 362/222 |
| 2010/0102729 | A1* | 4/2010 | Katzir | H05B 33/0803 315/113 |
| 2010/0124054 | A1* | 5/2010 | Chen | F21V 19/003 362/221 |
| 2010/0201239 | A1* | 8/2010 | Mostoller | F21S 8/031 313/1 |
| 2010/0201269 | A1* | 8/2010 | Tzou | F21V 23/006 315/51 |
| 2011/0038146 | A1* | 2/2011 | Chen | F21V 19/001 362/225 |
| 2012/0040541 | A1* | 2/2012 | Liskow | H01R 12/778 439/67 |
| 2013/0113002 | A1* | 5/2013 | Radermacher | H01L 27/153 257/88 |
| 2013/0127338 | A1* | 5/2013 | Lee | F21V 23/02 315/52 |
| 2013/0208458 | A1* | 8/2013 | Huang | F21V 19/0045 362/218 |
| 2013/0215609 | A1* | 8/2013 | Liu | F21K 9/278 362/223 |
| 2013/0230995 | A1* | 9/2013 | Ivey | F21K 9/90 439/226 |
| 2014/0029249 | A1 | 1/2014 | Matsukawa | |
| 2014/0313713 | A1 | 10/2014 | Andrews | |
| 2015/0062889 | A1* | 3/2015 | Kika | F21S 8/031 362/223 |
| 2015/0276140 | A1 | 10/2015 | Demuynck et al. | |
| 2016/0178137 | A1* | 6/2016 | Jiang | F21V 3/061 362/222 |
| 2016/0255694 | A1 | 9/2016 | Jiang et al. | |
| 2018/0058637 | A1* | 3/2018 | Thiel | F21V 23/006 |
| 2018/0231190 | A1 | 8/2018 | Polychronakis | |

FOREIGN PATENT DOCUMENTS

| | | |
|---|---|---|
| DE | 102017109853 A1 | 11/2018 |
| EP | 2831493 | 10/2013 |
| WO | 0223956 A2 | 3/2002 |
| WO | 2007144365 A1 | 12/2007 |
| WO | 2011064305 A1 | 6/2011 |
| WO | 2013144858 A1 | 10/2013 |

\* cited by examiner

TUBE LAMP WITH LEADFRAME

CROSS-REFERENCE TO RELATED APPLICATIONS AND PRIORITY

The present application claims the priority from German Patent Application No. 102017131063.0 filed on Dec. 22, 2017. This present application claims the priority from European Patent Application No. 18152566 filed on Jan. 19, 2018. Each of these patent applications is incorporated by reference herein in its entirety.

TECHNICAL FIELD

The present invention relates to a tube lamp with a light engine based on a leadframe, in particular a LED retrofit tube lamp, for example with use in T5 and T8 lamps.

BACKGROUND

Fluorescent tube lamps are increasingly being replaced by retrofit tube lamps with semiconductor light elements (for example light-emitting diodes, LEDs). Such retrofit tube lamps usually have a housing in the form of a tubular bulb which is at least partially light-permeable (translucent or transparent), with two end caps at the two ends of the tubular bulb, a light engine which contains a majority of LEDs, and an electronic driver which supplies the LEDs with electrical energy with the necessary electrical parameters (current, voltage) for operation thereof.

The term "light engine" is usually used for the arrangement of the majority of LEDs and a holding structure for the LEDs, which contains electrically conductive structures and/or cables by means of which the LEDs can be supplied with electric power by the electric driver.

For the light engine, many retrofit LED tube lamps use a printed circuit board on which the LEDs are fastened, for example soldered. Such printed circuit boards are usually produced by etching of a blank which has a copper coat arranged on an electrically non-conductive substrate. This results in a high consumption of copper and correspondingly high production costs and strong environmental pollution.

From the German patent application DE 102017109853.4, the disclosure of which is incorporated completely herein by reference, it is known to build the light engine of a retrofit tube lamp on a so-called wiring board. Wiring boards consist of strips of an electrically conductive material (for example aluminum), which is laminated between electrically insulating, flexible layers (for example polyimide). The required circuit design can then be achieved by stamping out of parts of the electrically conductive strips. The LEDs can be connected to the electrically conductive strips by openings in one of the electrically insulating layers.

The production of wiring boards with all advantages relative to printed circuit boards is also elaborate and expensive.

SUMMARY

Starting from the known prior art, it is an object of the present invention to provide a light fixture with a simplified light engine.

This object is achieved by a lighting device with the features of the independent claim. Advantageous further embodiments are set out in the subordinate claims.

Accordingly, a light fixture is proposed which has a transparent tubular bulb, at least one end cap arranged on an end of the tubular bulb and a light engine arranged in the tubular bulb. According to the invention, the light engine has a leadframe on which a majority of semiconductor light elements, in particular LEDs, are arranged.

Electrically conductive structures which are stamped or cut out of a sheet metal (for example by means of laser cutting or water jet cutting) and function without an electrically insulating substrate (such as a printed circuit board) or electrically insulating, flexible layers (such as wiring boards), are designated here as leadframes. For production of a leadframe the conductive tracks are stamped or cut out of a sheet, wherein transport strips and connection bars for stabilization of the stamped sheet remain for further processing. The transport strips and connection bars are removed at a later time, for example if the leadframe is sufficiently stabilized by electrical components fastened thereon.

The fastening of the semiconductor light elements takes place by a SMD soldering technique (SMD stands for "surface-mounted device"), in which the solder points on the stamped out sheet metal parts (conductive tracks) are provided with a soldering paste, then equipped with the semiconductor light elements and finally are heated by infrared radiation from a melting furnace, whereby the soldering paste melts. In this way the semiconductor light elements are connected to the conductive tracks.

The leadframe is a flat structure which has two opposing surfaces extending substantially parallel at a distance of the sheet thickness. The leadframe can be manufactured for example from a cost-effective material, such as for instance steel, or a material with high thermal conductivity, such as for instance copper, or a metal with an optically high grade appearance, such as brass. The sheet thickness is preferably in the range from 0.1 mm to 2 mm, more preferably in the range from 0.2 mm to 0.8 mm. In particular materials which can be used for printed circuit boards (PCBs) are suitable. Moreover, the leadframe can be coated for example with a Sn, Zn, Au, Ag, Pt, Pd or Ni layer, and/or the surfaces of the leadframes can be partially or completely roughened. The surfaces of the leadframe can also be coated with a good reflecting coating, for example with a white or bright color or lacquer layer (in particular solder resist).

Thus, the production of a leadframe is simpler than that of a wiring board or a printed circuit board. The conductive structures can also be chosen more flexibly than in the case of a wiring board. The heat dissipation from the semiconductor light elements during operation is improved by the thermal conductivity of the metallic leadframes.

Within the context of the present disclosure "arranged on the leadframe" means that the corresponding component is fastened to the leadframe and is electrically connected to the leadframe.

The components can be arranged on one surface or on both surfaces of the leadframe. In particular in the case of the semiconductor light elements, a better all-round transmission of the light can be achieved by equipping the leadframe on both sides.

In one embodiment the light fixture has two end caps which are arranged at opposing ends of the tubular bulb. Such a light fixture can have T5 or T8 models.

In one embodiment the light fixture has precisely one end cap which is arranged at an end of the tubular bulb. The other end of the tubular bulb can be closed by the material of the tubular bulb. Such a light fixture can for example be configured as a retrofit lamp for a compact fluorescent lamp.

In one embodiment the tubular bulb is closed in a gas-tight manner. The gas-tight tubular bulb is preferably filled with a filling gas which in particular has a gas with a high thermal conductivity. The gas with high thermal conductivity can be for example helium, oxygen or hydrogen or a mixture of these (for example helium/hydrogen or helium/oxygen). The removal of heat from the semiconductor light elements during operation can be further improved by filling of the tubular bulb with a gas with high thermal conductivity.

The filling gas can have further gaseous components by which for example high internal container pressures and/or optical light changes, such as light filtering and improved light output can be achieved. For example, the filling gas can also comprise nitrogen, argon, air, neon, carbon dioxide, nitrogen dioxide or sulfur hexafluoride.

Advantageously, the proportion of the gas with a high thermal conductivity in the filling gas is 1-100%, preferably 50-90%.

In practice the gas pressure in the container is between 0.01 and 1200 hPa, wherein a preferred gas pressure is between 0.1 and 1000 hPa.

In one embodiment the light fixture has an electronic driver with several electronic components, wherein at least one of the electronic components is arranged inside the tubular bulb. One, several, or all electronic components can be arranged inside the tubular bulb. Preferably, in particular, electronic components that are expected to emit a gas during operation are arranged outside the tubular bulb. This prevents the gas emissions from changing the filling gas present in the tubular bulb and thus possibly changing the characteristics thereof.

A further advantage of the use of a leadframe as a carrier for the semiconductor light elements is that gas emissions through the carrier (in known light fixtures for example through the printed circuit board or the wiring board) are substantially reduced.

It is advantageous to arrange as many electrical components of the electronic driver as possible inside the preferably gas-tight tubular bulb. In this way the components of the light fixture are protected in the best possible manner against external influences and the light fixture can be used in surroundings with demanding environmental conditions, for example as street lighting, in greenhouses, in coastal regions with a high salt content in the air, production environments with aggressive gases, etc.

Depending upon the operational environment, the semiconductor light elements can be selected with a correspondingly suitable spectral range. In this case all semiconductor light elements can emit light in substantially the same spectral range, or two or more different types of semiconductor light elements can be used, for example semiconductor light elements which emit blue and red light for the illumination of plants.

In one embodiment at least one of the electronic components arranged inside the tubular bulb is arranged on the leadframe. In this way the leadframe can ensure the electric connection of the electronic component. As a result, a printed circuit board, on which further electronic components of the electronic driver are arranged, can be as small as possible. This further decreases possible gas emissions in the interior of the tubular bulb through the printed circuit board.

In one embodiment, the leadframe has a central region on which the majority of semiconductor light elements is arranged and at least one end region on which at least one of the electronic components of the electronic driver is arranged. As a result, in particular, the electronic components of the electronic driver, which are larger than the semiconductor light elements, are arranged at the ends remote from the semiconductor light elements, where they hinder the emission of light through the semiconductor light elements as little as possible.

However, electronic components of the electronic driver can also be arranged in the central region of the leadframe.

If the electronic components of the electronic driver are arranged in both end regions of the leadframe, the leadframe can have additional connecting sections which connect the two end regions electrically.

In order to prevent such connecting sections, which extend over the entire length of the leadframe, from causing undesirable electromagnetic interference (EMI), these connecting sections can be connected to adjacent sections of the leadframe at one or more locations by means of capacitors. This procedure is described for example in the German patent application DE 102017103184.7, the disclosure of which is incorporated completely herein by reference.

In one embodiment, the width of the leadframe in at least one end region is greater than the width of the leadframe in the central region. As a result there is sufficient space available for the electronic driver, whilst the central region with the semiconductor light elements can be as narrow as possible. For reasons of material saving (environmental and cost advantages) it is advantageous to design the central region to be as narrow as possible. For example, the width of the leadframe in the central region is between approximately 6 mm and approximately 10 mm, preferably between approximately 7 mm and approximately 8 mm. In particular, if no connecting sections are required for parts of the electronic driver in both end regions of the leadframe, the width of the central region can be approximately 7 mm. With additional connecting sections the width of the central region can reach up to approximately 10 mm.

In one embodiment the width of the leadframe is variable over its length. In particular the width of the leadframe can change linearly, preferably continuously linearly, over the length, for example from a first width at a first end of the leadframe to a second width which is smaller than the first width at a second end of the leadframe. As a result, sufficient space can be provided at the wider end of the leadframe for the electronic driver.

Furthermore, an embodiment of the leadframe with a continuously linearly changing width has the advantage that several leadframes can be produced without cutting-waste from a starting material, in that a narrow end and a wide end of neighboring leadframes are alternately arranged adjacent to one another.

Manufacture of several leadframes without cutting-waste from a starting material can also be achieved if only one of the end sections of the leadframe is wider than the central section, and preferably approximately twice as wide as the central section. Then during the manufacture the wide end section of the first, third, etc. leadframes can be arranged adjacent to one another on one side and the wide end sections of the second, fourth, etc. leadframes can be arranged on the other side, that is to say the corresponding leadframes are rotated by 180°.

In one embodiment the electronic driver is a linear driver. Linear drivers for LED lamps are known for example from the international patent applications WO 2007/144365 A1 and WO 02/23956 A2, the disclosure of which is incorporated completely herein by reference. The linear drivers disclosed in these publications can also be used in embodiments of the light fixture according to the invention.

A linear driver has the advantage that it functions with very few electronic components. The core piece of the linear driver is a current regulator which is usually available as an integrated circuit (IC). In the above-mentioned publications a transistor or a LM317AT from National Semiconductor can be used as current regulator. As an alternative a BP5151HC from Bright Power Semiconductor Co. can be used.

In a linear driver attention must be paid to a good cooling, in particular in the case of a current regulator. Preferably, therefore, the current regulator is arranged on the leadboard, whereby the heat generated by the current regulator in operation can be easily dissipated.

In one embodiment the electronic driver is embedded in a filling material. The filling material can comprise a polymer (for example casting resins and/or highly viscous adhesives made of silicone, polyurethane, polyacrylic, polyester, polyamide, polyolefin and/or epoxy) and/or a filler (for example glass beads, sand, lime, ceramic powders such as for example $Al_2O_3$ or a mixture thereof). The polymer mass can be translucent (in particular transparent). Furthermore, the driver embedded in the filling material can be provided with a sealing coat (for example polymer). The polymer mass can cure under the effect of temperature, UV, moisture and/or time.

The heat-conducting connection of the electronic driver into the glass bulb can be improved by embedding of the electronic driver in such a filling material (potting). In particular the heat generated by the current regulator and/or by the capacitor in operation can be dissipated better onto the wall of the glass bulb and onto the end cap.

Furthermore, possible gas emissions from the electronic components can be isolated from the light engine with the semiconductor light elements by the potting of the electronic driver. This may be of interest, in particular, in the case of electrolyte capacitors used as smoothing capacitors.

Such potted electronic drivers are preferably arranged at one end (i.e. only in one end cap) in the lamp, since the filling operation can take place on the lamp which is closed at one end by gravity. In this case the electronic driver can be positioned both on the leadframe and also on a separate printed circuit board.

In the case of the separate printed circuit board, the electronic driver can also be pre-potted outside the lamp in order to surround the electronic components and to reduce possible gas emissions from the electronic components and the separate FR4 printed circuit board. Independently of this, the pre-potted driver can also be connected to the glass bulb by means of a subsequent further potting process.

In a further embodiment the lamp interior is also filled in the region of the semiconductor light elements with a translucent (in particular transparent) filling material (for example glass beads, glittering acrylic rhinestones with diamond effect, polymer granulate or a mixture thereof). In this way may the heat dissipation can be improved and the visual appearance of the light fixture can be influenced. Such an embodiment can have a particularly high-quality appearance. Moreover, it is possible to dispense with applying a slurry or internal matting of the glass bulb, which is normally carried out in order to render the interior of the lamp invisible from the exterior.

In order to save on weight and filling material, a partial coating of the bulb by such a translucent filling material (optical diffuser particles) can be carried out. In this case the bulb can be inclined and can be filled with a mixture of casting resin/adhesive with optical fillers (glass beads, ceramic powder, acrylic rhinestone-glitter stones with diamond effect, etc.). In this case, the low-viscosity casting resin/filler mixture runs downwards on the side opposite the semiconductor light elements (i.e. on the side towards which the light is emitted). In this case the lamp is preferably closed at one end and the electronic driver can be arranged at the bottom with regard to gravity and thus can be simultaneously embedded in the filling material. Alternatively, the lamp can also be initially filled with the low-viscosity pure casting resin/adhesive, followed by slight hardening so that the casting resin/adhesive becomes highly viscous, and finally the optical diffuser particles can be introduced which remain adhered on the highly viscous casting resin/adhesive strip.

Alternatively or in addition to casting resins and/or polymer adhesives, so-called hotmelt adhesives can also be used, i.e. adhesives which are initially present in solid form, for example as powder or granulate, and only become liquid when heated.

In this case the filling operation can take place completely by means of solid materials (hotmelt granulate and fillers such as glass beads, sand, lime or ceramic powder). The connection to the glass bulb and/or the electronic components takes place by subsequent heating, so that the hotmelt adhesive is melted.

Since hotmelt adhesives and polymer masses (polymer casting resin, polymer adhesive) are more expensive than the fillers, the quantity of holtmelt adhesive or polymer mass can be kept as small as possible by means of a 3-stage method: 1. Introduction of the pure fillers into the driver region of the lamp which is closed at one end, 2. Introduction of the hotmelt granulate onto the filler granulate. 3. Melting of the hotmelt sealing coat and sealing of the driver region.

This has the further advantage that the melting of the hotmelt sealing coat takes place spatially separately from the electronic components. In the ideal case the sealing coat is merely in contact with the temperature-resistant leadframe metal, the temperature-resistant soft glass enveloping bulb and the temperature-stable filling material (glass beads, sand, etc.).

In one embodiment the leadframe has one or more projections, in particular deep-drawn sections, embossings, etc. The projections can be located on the underside of the leadframe, i.e. on the surface on which no semiconductor light elements are arranged. On the top side of the leadframe, i.e. on the surface on which the semiconductor light elements are arranged, the projections then appear as depressions. In the region of the projections, i.e. substantially around the projections on the underside of the leadframe and/or on the projections, the leadframe can be provided with an adhesive by which the leadframe is fastened to the inside of the tubular bulb.

The projections reduce the spacing between the leadframe and the inner surface of the tubular bulb, so that a smaller quantity of adhesive is required when the leadframe is adhered to the tubular bulb at these locations.

The spacing between two semiconductor light elements is usually approximately 17 mm. In order to achieve a sufficient number of adhesion points, the spacing between two depressions can correspond to 2, 3, 4 or 5 times the spacing between the semiconductor light elements, in particular approximately 34 mm, 51 mm, 68 mm or 85 mm. Other spacings are also possible. The projections can also be unevenly distributed along the light engine.

Alternatively or in addition the leadframe can be fastened by means of retaining clips which are fastened to the inside of the tubular bulb. Such retaining clips are known from the international patent application WO 2011/064305 A1, the disclosure of which is incorporated completely herein by reference.

In one embodiment the leadframe has bent sections which can be produced by stamping on one side and bending. These can enlarge the cooling surface for electronic components which are subject to high thermal load.

Furthermore, the leadframe can be fastened to the inside of the tubular bulb by means of laser welding. In this case, at locations at which the leadframe abuts the inside of the bulb the leadframe is heated point by point by means of a laser through the glass of the bulb. The heat is transmitted to the glass and the glass is melted. In this way the leadframe is fused with the glass.

The material of the leadframe is preferably selected so that—in addition to the necessary electrical conductivity and solderability—it has a similar coefficient of thermal expansion to the glass of the tubular bulb. For example, the tubular bulb can be made from a conventional soda-lime glass with a coefficient of thermal expansion of approximately 9.8 ppm/K and the leadframe can be made from DC01 steel with a coefficient of thermal expansion of approximately 10.5 ppm/K. In the case of a light fixture having a length of 1.5 m at a temperature different from 100 K (for example −20° C. to 80° C.) the difference of 0.7 ppm/K corresponds to a difference in the longitudinal dimension of approximately 0.1 mm. Such a difference can be compensated for without problems by the aforementioned fastening methods. As a result, in particular, the direct adhesion of the leadframe onto the inside of the tubular bulb is made possible.

In one embodiment the electronic driver has a printed circuit board on which at least one of the electronic components is arranged. Thus the electronic components of the electronic driver can be all arranged on the printed circuit board, all arranged on the leadboard or can be arranged partially on the printed circuit board and partially on the leadboard. The printed circuit board can be arranged completely inside the tubular bulb or at least partially in an end cap of the light fixture.

The printed circuit board can be connected to the leadframe by means of at least one electrically conductive connecting element.

Two printed circuit boards for electronic components of the electronic driver can also be provided, wherein each printed circuit board can be arranged completely inside the tubular bulb or at least partially in an end cap of the light fixture. The electronic components of the electronic driver can then be distributed over the two printed circuit boards. Accordingly, two electrically conductive connecting elements are then provided for connection between the printed circuit board and the leadframe.

It may also be provided that a first printed circuit board is arranged completely inside the tubular bulb (which is possibly closed gas-tight) and a second printed circuit board is arranged outside the tubular bulb at least partially in an end cap of the light fixture. As a result, electronic components which exhibit undesirable gas emission can be arranged outside the tubular bulb, whilst the other electronic components are arranged in the interior of the tubular bulb, where they are protected against environmental influences.

In one embodiment the leadframe has a bent section which serves as a connecting element. To that in particular one of the stamped-out or cut-out metal surfaces of the leadframe can be bent at least partially into the shape of a connecting element. The material used for the leadframe can have spring characteristics which ensure that the bent part of the leadframe presses against corresponding contact areas on the printed circuit board.

In one embodiment the light engine also has an electrically conductive means, in particular a cable, which extends from a first end of the leadframe or a printed circuit board arranged on the first end of the leadframe to a second end of the leadframe or to a printed circuit board arranged on the second end of the leadframe. As a result, an electrical connection can be achieved between the two ends of the leadframe or between sections of the electronic driver arranged on both ends, without the provision of corresponding sections therefor in the leadframe. This makes it possible to make the leadframe extremely narrow.

Furthermore, in one embodiment the light engine has one or more stabilizing sections which are made from an insulating material and which are introduced locally, preferably in a punctiform and/or linear manner, into intermediate spaces of the leadframe in order to fasten sections of the leadframe to one another and preferably to space them apart from one another.

In this connection "locally" means, in particular, that the leadframe is not completely or for the most part embedded in a housing or a shell, for instance made from plastics material. The stabilizing sections are characterized in that they are provided locally at points on the leadframe at which a stabilization and optionally a spacing is necessary in order to ensure the mechanical and electrical functionality of the LED module. Thus the stabilizing sections can be provided, in particular, in spaces, for instance gaps, so as to prevent an inadvertent bending together and contacting of sections of the leadframe which are to be insulated electrically.

The stabilizing sections are preferably manufactured from polymer and/or glass and/or ceramic and/or cement and/or SMD components with insulating properties. SMD components with insulating properties comprise: resistors with an extremely high resistance in the mega- or giga-ohm range; diodes in locking direction; capacitors in direct current applications or the like. Epoxy resin adhesive has proved to be advantageous as a polymer, of which the coefficient of thermal expansion is in the same order of magnitude as a possible polymer housing of semiconductor light elements such as LEDs and thus, in the event of changing temperature load, causes no thermal stresses on the semiconductor light elements. Alternatively or in addition, other polymers may also be considered, such as for instance thermoplastics, for example PC, PMMA, PBT, thermosetting plastics or elastomers, such as for example silicones.

In this way the leadframe of the light engine is stabilized particularly well so that, even after the removal of the initially stabilizing connecting webs, it can be readily manipulated during the installation in the tubular bulb.

Such stabilization can be advantageous, in particular, where longer sections of the leadframe extend alongside one another without being connected to one another by means of electronic components (such as components of the electronic driver or capacitors for reduction of electromagnetic interference emissions).

The two surfaces of the leadframe preferably for the most part have no contact with material of the stabilizing sections. "For the most part", in this use, means that more than half, preferably more than 80%, of both surfaces (considered individually) are not in contact with stabilizing sections. Preferably both surfaces (considered individually) of the leadframe are (in the sense defined above) uncovered, i.e. moreover they also have no contact with LEDs, SMD components, solder points etc. This, in particular, improves the heat dissipation via the leadframe onto the gas located in the tubular bulb.

For the same reasons, the individual stabilizing sections are preferably distinguishable, i.e. they do not overlap to form a structure in the order of magnitude of the leadframe. Accordingly, the expansion of the individual stabilizing sections preferably corresponds to only a small part of the overall expansion of the leadframe. In particular, the leadframe preferably has electrically insulating intermediate spaces, for instance gaps or gap sections, which are not filled and thus completely penetrate the leadframe in the direction of the thickness. The expansion of the stabilizing section preferably corresponds substantially to the order of magnitude of the intermediate spaces to be bridged.

BRIEF DESCRIPTION OF THE DRAWINGS

Preferred further embodiments of the invention are explained in greater detail by the following description of the drawings. In the drawings.

DETAILED DESCRIPTION OF THE DRAWINGS

Figure 1:
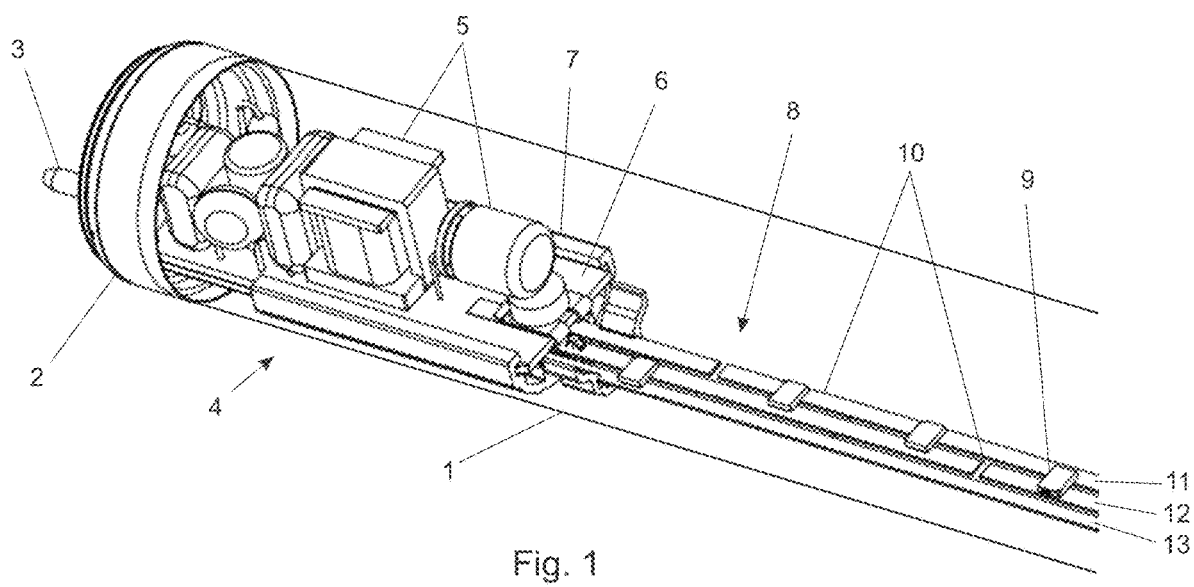
FIG. 1 shows an embodiment of a tube lamp according to the present invention.

Preferred exemplary embodiments are described below with reference to the drawings. In this case elements which are the same, similar, or act in the same way are provided with identical reference numerals in the different drawings, and repeated description of some of these elements is omitted in order to avoid redundancies.

An embodiment of a tube lamp according to the invention is partially shown in FIG. 1. The tube lamp has a light-permeable tubular bulb 1, and on the two ends an end cap 2 is arranged. Two connecting pins 3, retain the tube lamp in a corresponding socket and supply the tube lamp with electrical power, are fastened in the end cap.

In the interior of the end cap 2 and extending from there into the interior of the tubular bulb 1 there is an electronic driver 4, of which the electronic components 5 are arranged on a printed circuit board 6. The driver 4 is retained securely in the interior of the tube lamp by means of a retaining bar 7 on the inside of the tubular bulb 1.

A leadframe 8 on which several light-emitting diodes (LEDs) 9 are arranged can be used as a light engine. The leadframe 8 comprises several sections 10 which have been stamped out or cut out of a sheet metal (for example DC01 steel).

In the illustrated embodiment the leadframe 8 has substantially three parallel strips, wherein the first strip 11 (shown in the drawing as the rear strip) and the second strip 12 (shown in the drawing as the middle strip) are in each case composed of several sections 10. On the other hand, the third strip 13 (shown in the drawing as the front strip) is continuous over the length of the leadframe 8. In this case the designations "front", "middle" and "rear" relate to the representation in the drawing and are used below synonymously with the "first", "second" and "third" strip. The sections 10 of the rear strip 11 and the middle strip 12 are arranged offset with respect to one another, so that in each case they overlap by half a section 10. Between the right-hand region (in the drawing) of a section 10 of the rear strip 11 and the left-hand region (in the drawing) of a section 10 of the middle strip 12 two LEDs 9 are parallel-connected to one another. Between the right-hand region (in the drawing) of a section 10 of the middle strip 12 and the left-hand region (in the drawing) of a section 10 of the rear strip 11 two LEDs 9 are likewise parallel-connected to one another, so that the first-mentioned group of parallel LEDs and the second group of parallel LEDs are connected in series. This pattern continues over the length of the leadframe 8.

The first (left-hand) section of the rear strip 11 is connected to a first output terminal of the electronic driver 4. The last pair with two parallel LEDs 9' (not shown in FIG. 1, but visible in FIG. 4) is connected to the right-hand section of the middle strip 12 and to the front (continuous) strip 13. As a result, the connection to a second output terminal of the electronic driver 4 is achieved and the current circuit is closed. Instead of two LEDs, a 0-ohm resistor or another conductive element can be used for the connection between the middle strip 12 and the front strip 13. Alternatively or in addition, one or more connection bars can be retained for closure of the current circuit, i.e. during separation of the individual sections of the leadframe these connection bars are not severed.

Figure 2:
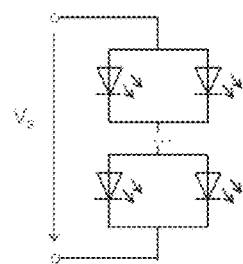
FIG. 2 shows a schematic representation of the electrical circuit of the LEDs in the embodiment according to FIG. 1.

Thus the LEDs are arranged as a series connection of parallel-connected pairs of LEDs, as shown schematically in FIG. 2.

Figure 3:
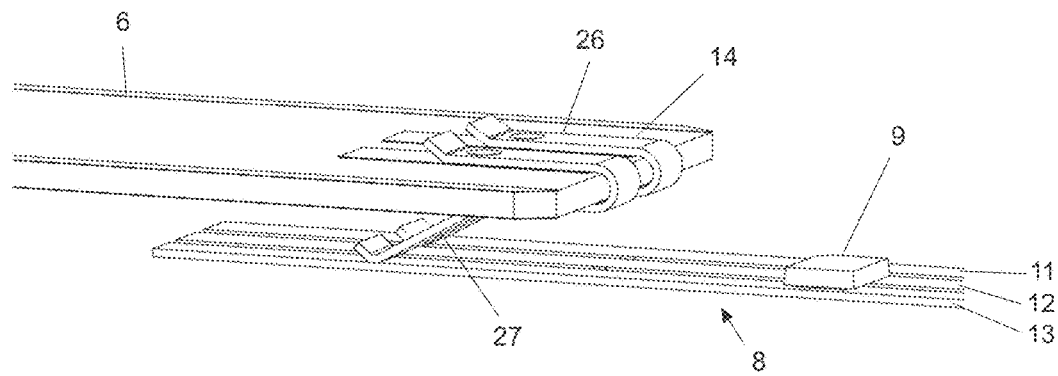
FIG. 3 shows an embodiment of the connection between the printed circuit board and the leadframe.

FIG. 3 shows an embodiment of the connection between the printed circuit board of the electronic driver 4 and the leadframe 8. Two contact clips 26 are in each case fitted with a substantially U-shaped contact region 14 onto the printed circuit board 6 of the driver 4 so that on the printed circuit board 6 the U-shaped contact regions 14 contact correspondingly arranged contact points which constitute the two output terminals of the driver 4. Connection regions 27, which contact corresponding sections 10 of the leadframe 8, extend from the lower branch of the U-shaped contact region 14. As a result, an electrical connection between the printed circuit board of the electronic driver 4 and the leadframe 8 is produced.

Alternatively here, the left-hand end (in the drawing) of the front strip 13 and of the first (left-hand) section of the rear strip 11 are bent so that two substantially U-shaped contact regions 14 are produced, into which the printed circuit board 6 of the driver 4 is inserted. Then on the printed circuit board 6 the U-shaped contact regions 14 contact correspondingly arranged contact points which constitute the two output terminals of the driver 4. As a result the corresponding sections 10 of the leadframe 8 assume the function of the contact clips 26.

Figure 4:
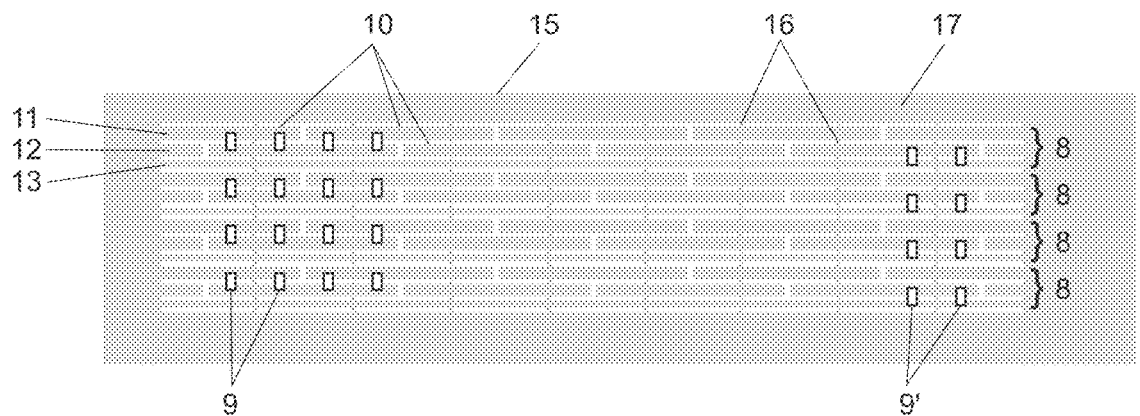
FIG. 4 shows schematically an arrangement of several leadframes of an embodiment during the production.

FIG. 4 shows schematically an arrangement of several leadframes 8, such as can be used in an embodiment of a light fixture according to FIG. 1 or in other embodiments, during the production. The leadframes 8 have been stamped out or cut out from a plate 15 (for example by means of laser cutting) and are still connected by means of connection bars 16 to a frame 17 and to one another. Four leadframes 8 are shown in FIG. 4, but a different number of leadframes 8 can be produced from one plate 15.

Each leadframe 8 has three strips, an upper strip 11 (corresponding to the first strip or rear strip in FIG. 1), a middle strip 12 (corresponding to the second strip or middle strip in FIG. 1) and a lower strip 13 (corresponding to the third strip or front strip in FIG. 1). In this case the designations "upper", "middle" and "lower" relate to the representation in the drawing and are used below synonymously with the "first", "second" and "third" strip.

The upper strip 11 and the middle strip 12 are in each case composed of several sections 10. The lower strip 13 is continuous over the length of the leadframe. The sections 10 of the upper strip 11 and the middle strip 12 are arranged offset with respect to one another, so that in each case they overlap by half a section 10. Between the right-hand region (in the drawing) of a section 10 of the upper strip 11 and the left-hand region (in the drawing) of a section 10 of the middle strip 12 two LEDs 9 are parallel-connected to one another. Between the right-hand region (in the drawing) of a section 10 of the middle strip 12 and the left-hand region (in the drawing) of a section 10 of the upper strip 11 two LEDs 9 are likewise parallel-connected to one another, so that the first-mentioned group of parallel LEDs and the second group of parallel LEDs are connected in series. This pattern continues over the length of the leadframe 8. For reasons of clarity, not all of the LEDs 9 are shown.

The last pair with two parallel LEDs 9' is connected to the right-hand section of the middle strip 12 and to the lower (continuous) strip 13. Instead of two LEDs, a 0-ohm resistor or another conductive element can be used for the connection between the middle strip 12 and the lower strip 13. Alternatively or in addition, one or more connection bars 16 can be retained for closure of the current circuit, i.e. during separation of the individual sections of the leadframe 8 these connection bars 16 are not severed.

Stabilizing sections can be provided between the sections 10 and/or between the strips 11, 12, 13 of the leadframe 8 for stabilization of the leadframe 8. In particular, the continuous lower strip 13 is preferably connected locally to the adjacent middle strip 12 by stabilizing sections (insulating material or insulating SMD components).

When all LEDs 9 are mounted on the leadframe 8 and are connected thereto, the connection bars 8 can be severed and the leadframes 8 can be separated from the frame 17 and from one another.

The width of the leadframe 8 is preferably approximately 7 mm. Thus sufficient space is available for the LEDs 9 on the leadframe 8 without unnecessarily requiring material for the leadframe 8. The width of the upper strip 11 and the middle strip 12 is preferably approximately (2.0±0.1) mm. The width of the lower strip 11 is preferably approximately (1.6±0.1) mm. The width of the stamped openings between the strips is preferably (0.7±0.1) mm. The width of the stamped openings between the sections 10 in one strip is preferably (1.0±0.1) mm. The length of the sections 10 of the upper strip 11 and the middle strip 12 is preferably approximately (67.6±0.5) mm. The length of the leadframe 8 is preferably 17 sections 10, i.e. approximately 1166 mm. Thus in a lamp with an overall length of 1200 mm (also called a 4-foot lamp) space still remains for an electronic driver. If a stamping tool which is shorter than the leadframe is to be used a number of times, the leadframe can also be produced first of all with a length of 18 sections and a section can be removed later. For reasons of better identification fewer sections are shown in the drawing. The above-mentioned dimensions can also be used in the subsequent leadframes.

Thus with four LEDs per section there are 66 or 68 LEDs, depending upon whether the connection between the middle strip 12 and the lower strip 13 takes place by two LEDs 9' or by a 0-ohm resistor. With an operating voltage of 3 V per LED this produces an overall operating voltage of 198 V or 204 V. Such a voltage can be generated for example by a linear driver.

In the embodiment according to FIG. 4 the first section (on the left in the drawing) of the upper strip 11 has a length which corresponds to ¾ of the length of the further sections 10. The last section (on the right in the drawing) of the upper strip 11 likewise has a length which corresponds to ¾ of the length of the further sections 10. The first section (on the left in the drawing) of the middle strip 12 has a length which corresponds to ¼ of the length of the further sections 10. Correspondingly the last section (on the right in the drawing) of the middle strip 12 likewise has a length which corresponds to ¼ of the length of the further sections 10.

However, the first sections (on the left in the drawing) and/or the last sections (on the right in the drawing) can also be designed to be longer, which can simplify the connection to the driver, in particular when end sections of the leadframe are converted into contact regions (see FIG. 3).

Figure 5:
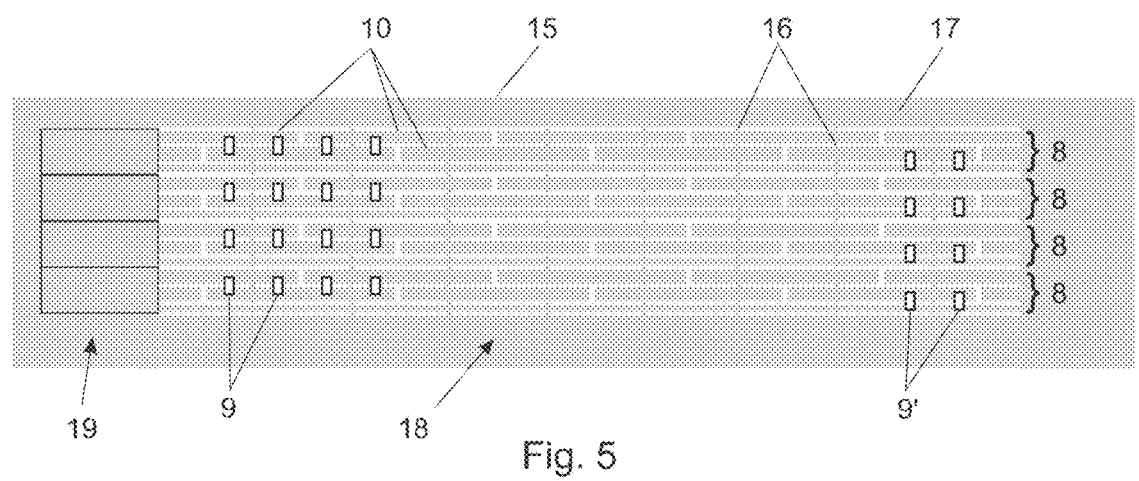
FIG. 5 shows schematically an arrangement of several leadframes of a further embodiment during the production.

FIG. 5 shows schematically an arrangement of a plurality of several leadframes 8 in a further embodiment during the production. Each leadframe 8 has a central region 18 and an end region 19.

The central region 18 of the leadframe 8 in FIG. 5 corresponds to the leadframe illustrated in FIG. 4 and is not explained again here. However, other configurations of the leadframe in the central region 18 can be used.

The end region 19 of the leadframe 8 is provided for electronic components 5 of the driver 4. The precise division of the end region 19 into leadframe sections depends upon the design of the driver 4 and is therefore not illustrated in detail here.

The width of the leadframe 8 is preferably approximately 7 mm. Thus sufficient space is available for the LEDs 9 and the electronic components 5 of the driver on the leadframe 8 without unnecessarily requiring material for the leadframe 8.

Figure 6:
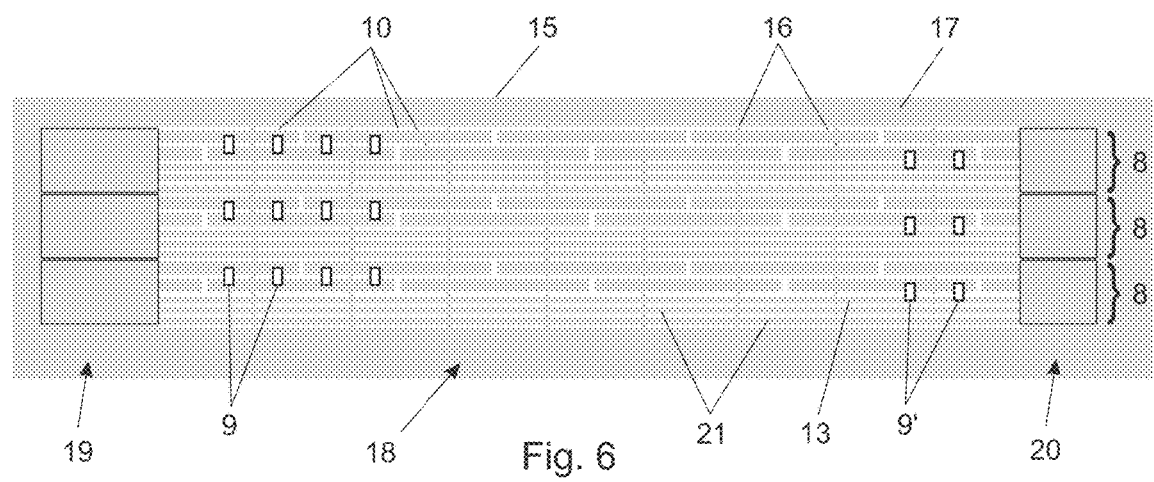
FIG. 6 shows schematically an arrangement of several leadframes of a further embodiment during the production.

FIG. 6 shows schematically an arrangement of several leadframes 8 in a further embodiment during the production. Each leadframe 8 has a central region 18 and two end regions 19, 20.

The end regions 19, 20 of the leadframe 8 are provided for electronic components 5 of the driver 4. The precise division of the end regions 19, 20 into leadframe sections depends upon the design of the driver 4 and is therefore not illustrated in detail here. An embodiment of the division of the end region of the leadframe 8 is illustrated by way of example in FIGS. 17 to 20. The division of the driver 4 over two end regions 19, 20 makes it possible to design the end regions 19, 20 in each case to be smaller and so to distribute the non-luminous region over the two ends of the light fixture.

The central region 18 of the leadframe 8 in FIG. 6 corresponds substantially to the leadframe illustrated in FIG. 4 and in this respect is not explained again here. However, other configurations of the leadframe in the central region 18 can be used. In addition, to the section of the leadframe 8 taken from FIG. 4 (i.e. the three upper strips 11, 12, 13) the leadframe has two further strips 21 which serve for connection of the two parts of the electronic driver 4.

The strips 21 are preferably connected to one another and/or are connected locally to the adjacent lower strip 13 by stabilizing sections (insulating material or insulating SMD components). Stabilization can take place in particular by capacitors which can prevent or at least reduce undesirable electromagnetic interference.

The width of the leadframe 8 is preferably approximately 10 mm. Thus sufficient space is available for the LEDs 9 and the electronic components 5 of the driver on the leadframe 8 without unnecessarily requiring material for the leadframe 8. The additional strips 21 give rise to a wider configuration of the leadframe 8 by comparison with the preceding embodiments.

Figure 7:
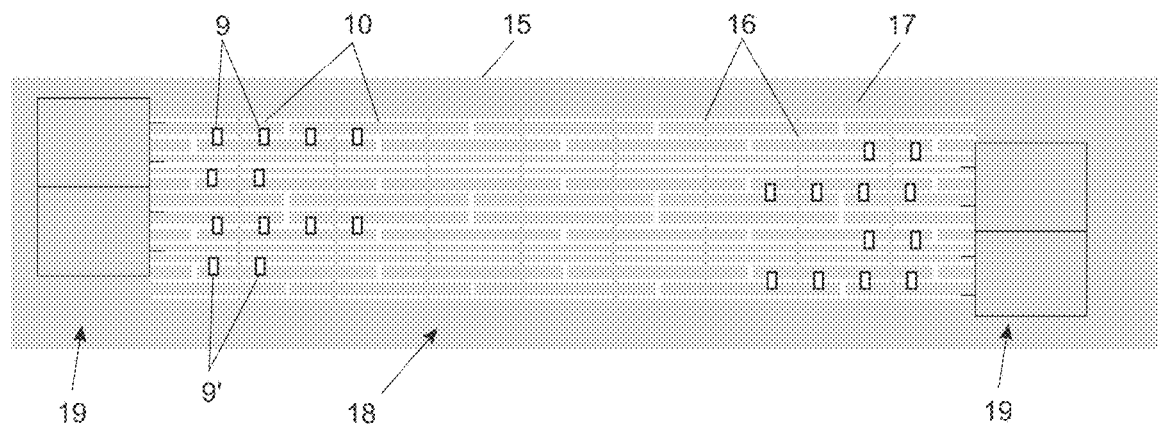
FIG. 7 shows schematically an arrangement of several leadframes of a further embodiment during the production.

FIG. 7 shows schematically an arrangement of several leadframes 8 in a further embodiment during the production. Each leadframe 8 has a central region 18 and an end region 19.

The end region 19 of the leadframe 8 is provided for electronic components 5 of the driver 4. The precise division of the end region 19 into leadframe sections depends upon the design of the driver 4 and is therefore not illustrated in detail here.

The end region 19 is twice as wide as the central region 18, so that in the end region 19 more space is available for the electronic components 5 of the driver 4. The width of the central region 18 of the leadframes 8 is preferably approximately 7 mm, and thus the width of the end region is approximately 14 mm. Thus sufficient space is available for the LEDs 9 and the electronic components 5 of the driver on the leadframe 8 without unnecessarily requiring material for the leadframe 8.

The leadframes 8 in which the end region 19 is arranged on the left-hand side (in the drawing) correspond to the leadframes according to FIG. 5 (apart from the width of the end region 19). By comparison, the leadframes 8 in which the end region 19 is arranged on the right-hand side (in the drawing) are rotated by 180°.

Figure 8:
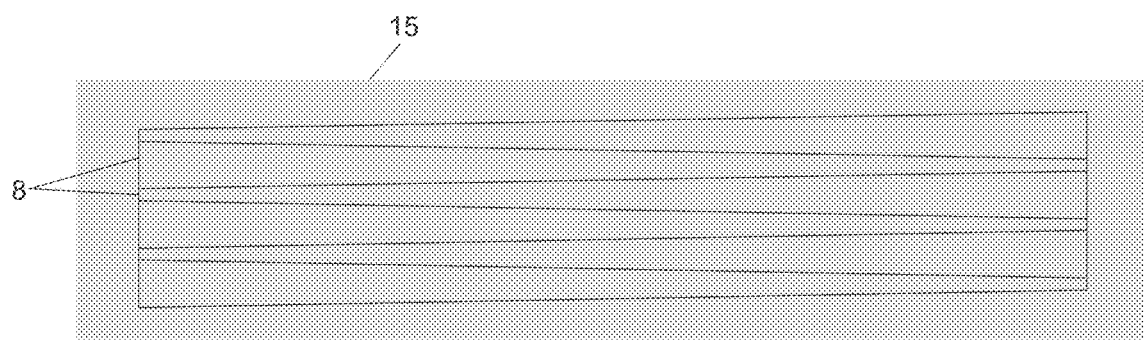
FIG. 8 shows schematically an arrangement of several leadframes of a further embodiment during the production.

FIG. 8 shows schematically an arrangement of several leadframes 8 in a further embodiment during the production. In particular, the width of the leadframes 8 is reduced from a first width at a first end of the leadframe 8 to a second width which is smaller than the first width at a second end of the leadframe 8. The width at the second end is preferably no more than approximately 7 mm, more preferably no more than approximately 5 mm. The width at the first end is preferably approximately 20 mm. As a result sufficient space can be provided at the wider end of the leadframe for the electronic driver.

For reasons of clarity, the division of the leadframe 8 into sections 10 is not illustrated here.

Figure 9:
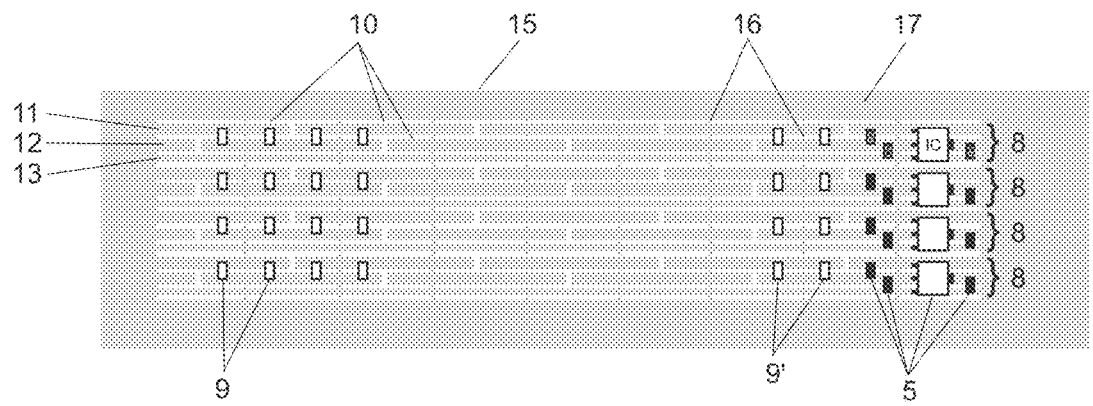
FIG. 9 shows schematically an arrangement of several leadframes of a further embodiment during the production.

FIG. 9 shows schematically an arrangement of several leadframes 8 in a further embodiment during the production. The arrangement of the strips 11, 12, 13 and sections 10 of the leadframe 8 corresponds substantially to the arrangement according to FIG. 4. In addition to the LEDs 9 electronic components 5 of the driver 4 are arranged here in the region of the light engine using the division of the two upper strips 11, 12 into sections 10.

Figure 10:
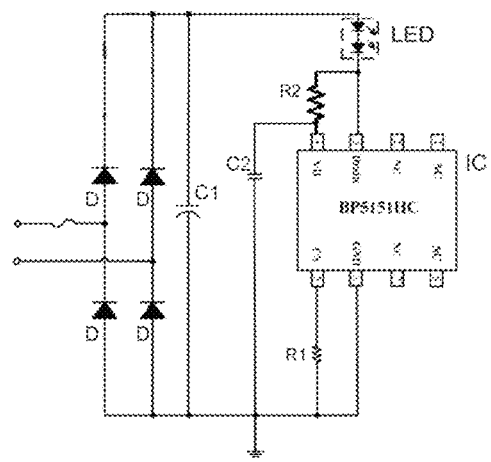
FIG. 10 shows a schematic representation of the electrical circuit of a linear driver for the LEDs.

A linear driver such as shown schematically in FIG. 10 can be used as an electronic driver 4. The electronic driver has a rectifier consisting of four diodes D, at the output of which a smoothing capacitor C1 is provided. A connection of the smoothing capacitor C1 is connected to earth. An integrated circuit IC of the BP5151HC type can be used for the linear driver. The connection CS of the integrated circuit IC is connected to earth by means of a resistor R1. The connection VD of the integrated circuit IC is connected to earth by means of a capacitor C2. Furthermore, the connection VD of the integrated circuit IC is connected by means of a resistor R2 to the cathode end of the series-connected LEDs. The drain connection of the integrated circuit IC is connected directly to the cathode end of the series-connected LEDs. The connection GND of the integrated circuit IC is connected to earth.

The integrated circuit IC of the BP5151HC type is usually obtainable in the form of the ESOP8 model, as also illustrated in FIG. 10. In this case the four connectors NC have no function. If the integrated circuit with the same functionality is used in the SOT223 or TO252 model, as shown in FIG. 9 it can be arranged together with the resistors R1 and R2 and the capacitor C2 directly in the region of the light engine on the leadframe.

The rectifier and the smoothing capacitor C1 (not shown in FIG. 9) can then be arranged in one or two end regions of the leadframe or on a separate printed circuit board.

Figure 11:
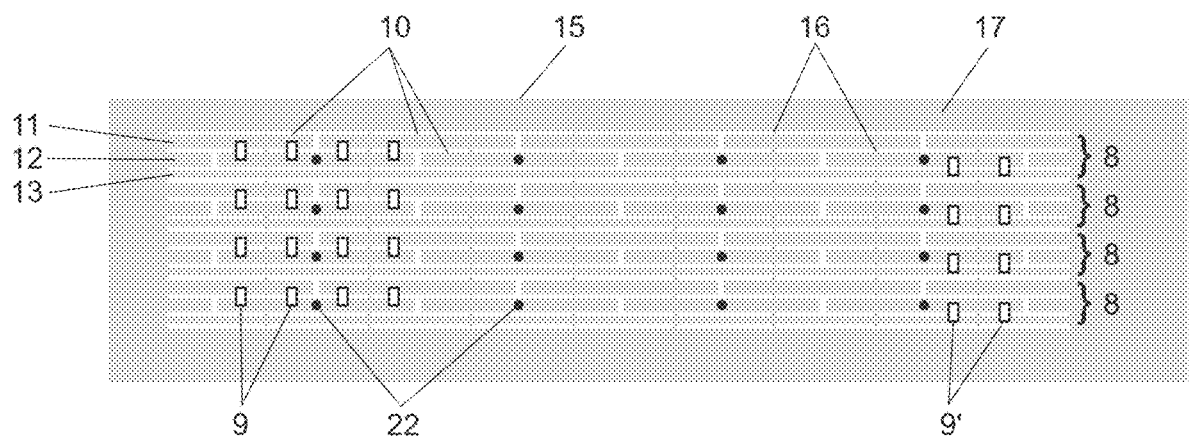
FIG. 11 shows schematically an arrangement of several leadframes of a further embodiment during the production.

FIG. 11 shows schematically an arrangement of several leadframes 8 in a further embodiment during the production. The leadframes 8 correspond substantially to the leadframes according to FIG. 4.

Figure 12:
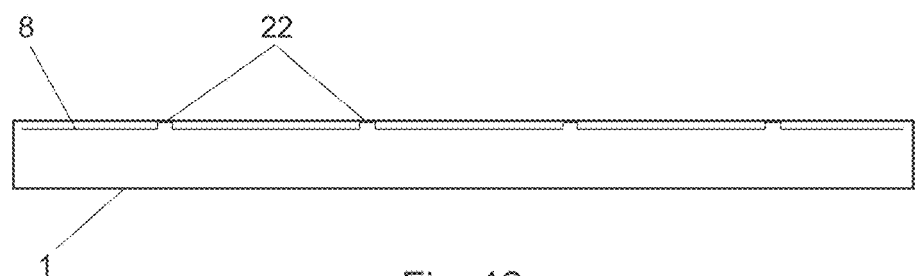
FIG. 12 shows schematically a side view of a leadframe corresponding to FIG. 11.

Approximately in the center of each section 10 of the middle strip 12 a depression 22 (viewed from the top face of the leadframe 8) is provided, which can be provided for example by embossing or deep drawing. FIG. 12 shows schematically a side view of a leadframe 8 with depressions 22 (again without LEDs) in a tubular bulb 1. The depressions 22 or the projections produced thereby on the other side of the leadframe 8 serve to reduce the spacing between the leadframe 8 and the inside of the curved tubular bulb 1. In this way a narrow adhesive gap is produced which reduces the quantity of adhesive to be used.

Figure 13:
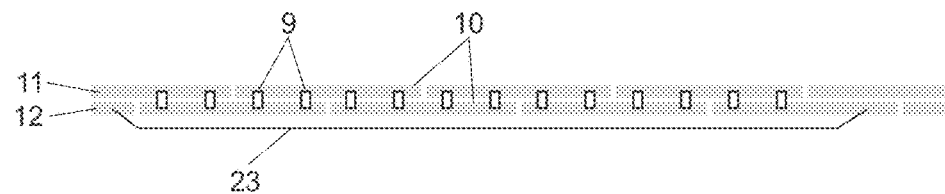
FIG. 13 shows schematically a leadframe with an additional connecting cable.

FIG. 13 shows schematically a leadframe 8 in a further embodiment. The leadframe 8 corresponds substantially to the leadframes according to FIG. 4, but does not have a lower strip 13. The electrical connection between the right-hand end (in the drawing) of the leadframe 8 and a driver (not shown) on the left-hand end of the leadframe can take place for example with a (schematically indicated) cable 23.

Figure 14:
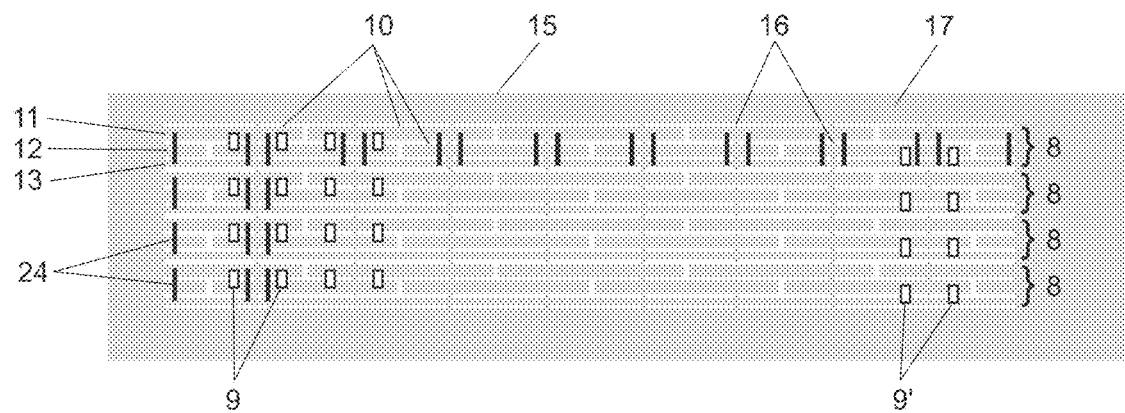
FIG. 14 shows schematically an arrangement of several leadframes of a further embodiment during the production.

FIG. 14 shows schematically an arrangement of several leadframes 8 in a further embodiment during the production. The leadframes 8 correspond substantially to the leadframes according to FIG. 4.

The three strips 11, 12, 13 of the leadframes 8 are connected to one another by stabilizing sections 24 made of insulating material, whereby the stability of the leadframes 8 is increased. Apart from the illustrated arrangement, the stabilizing section 24 can also be used for other arrangements. For reasons of clarity, not all of the stabilizing sections 24 are illustrated.

Figure 15:
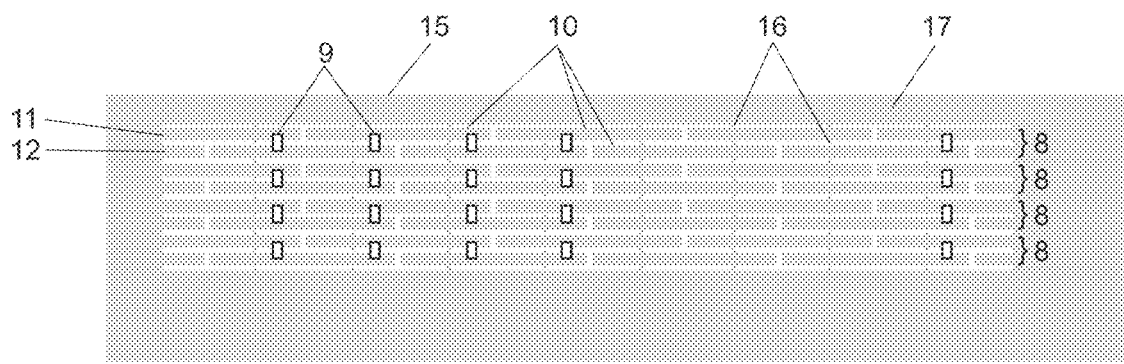
FIG. 15 shows schematically an arrangement of several leadframes of a further embodiment during the production.

FIG. 15 shows schematically an arrangement of several leadframes 8 in a further embodiment during the production. Each leadframe 8 has two strips, an upper strip 11 and a lower strip 12. In this case the designations "upper" and "lower" relate to the representation in the drawing and are used below synonymously with the "first" and "second" strip.

The upper strip 11 and the lower strip 12 are in each case composed of several sections 10. The sections 10 of the upper strip 11 and the lower strip 12 are arranged offset with respect to one another, so that in each case they overlap by half a section 10. One LED is connected between the right-hand region (in the drawing) of a section 10 of the upper strip 11 and the left-hand region (in the drawing) of a section 10 of the lower strip 12. A LED is likewise connected between the right-hand region (in the drawing) of a section 10 of the lower strip 12 and the left-hand region (in the drawing) of a section 10 of the upper strip 11, so that the LEDs are series-connected. This pattern continues over the length of the leadframe 8. For reasons of clarity, not all of the LEDs 9 are shown. Thus the leadframe 8 here brings about a series connection of all LEDs 9. A continuous strip for returning the electrical connection is not provided.

Figure 16:
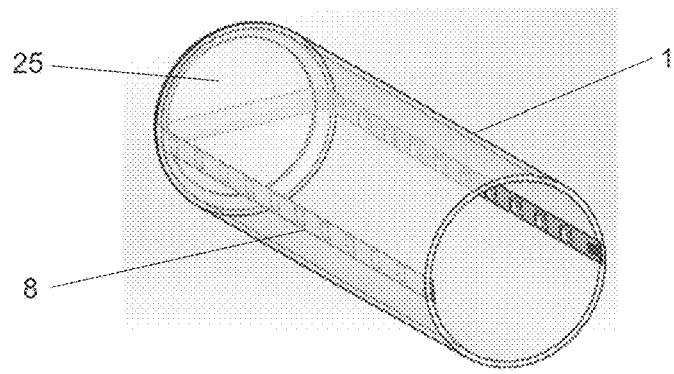
FIG. 16 shows an embodiment of a light fixture with a leadframe according to FIG. 15.

An embodiment of a light fixture in which the leadframe 8 illustrated in FIG. 15 can be used is illustrated in part in FIG. 16. The leadframe 8 is mounted on the inside of a tubular bulb 1 so that it extends from an open end of the bulb 1 to a closed end of the bulb 1, extends along the front face 25 there and subsequently extends from the closed end of the bulb 1 again to the open end of the bulb 1. Since both ends of the leadframe 8 lie at the open end of the bulb 1, they can be connected there to an electronic driver (not illustrated), without the need for a continuous strip for returning the electrical connection.

Accordingly, the other leadframes described above can also be used in each case without a continuous third strip in such a light fixture.

The leadframes 8 illustrated in FIGS. 9 to 15 can in each case be provided with one or two end sections 19, 20 for electronic components 5 of a driver 4, as illustrated in FIGS. 5 to 8.

FIGS. 17 to 20 illustrate by way of example how the end region or the end regions 19, 20 of a leadframe 8 can be divided into sections 10' so that the electronic components 5 of the driver 4 can be arranged directly on the leadframe 8.

Figure 17:
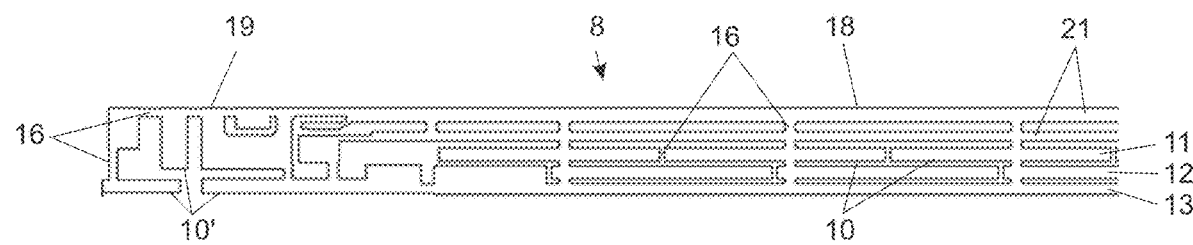
FIG. 17 shows schematically an embodiment of a first end region of a leadframe.

FIG. 17 shows a first end region 19 of the leadframe 8 schematically on the left in the drawing. On the right in the drawing the central region 18 of the leadframe is shown with three strips 11, 12, 13 (at the bottom in the drawing) of the light engine which in each case consist of several sections 10.

Figure 18:
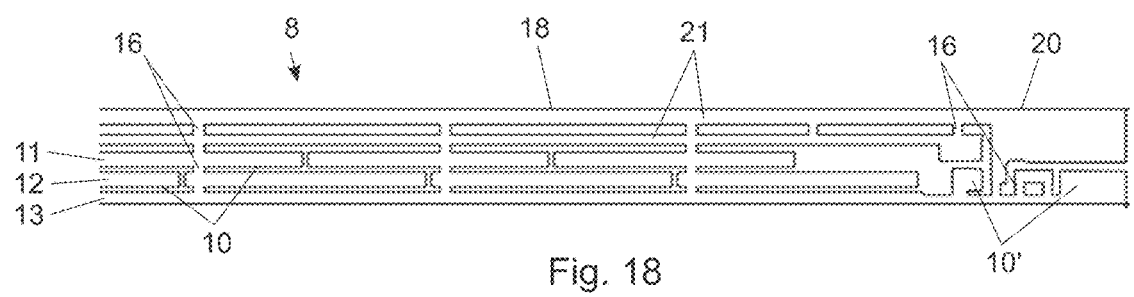
FIG. 18 shows schematically an embodiment of a second end region of a leadframe.

FIG. 18 shows a second end region 20 of the leadframe 8 schematically on the right in the drawing. On the left in the drawing the central region 18 of the leadframe is shown with three strips 11, 12, 13 (at the bottom in the drawing) of the light engine which in each case consist of several sections 10.

The two upper continuous strips 21 (the two upper strips in each case in FIGS. 17 and 18) serve for connection of the two driver sections, the components 5 of which are arranged in the two end regions 19, 20 of the leadframe 8.

The sections 10, 10' of the leadframe 8 are connected to one another by connection bars 16 in FIGS. 17 and 18. These can be severed after the electronic components 5 of the driver 4 are fastened on the leadframe 8.

Figure 19:
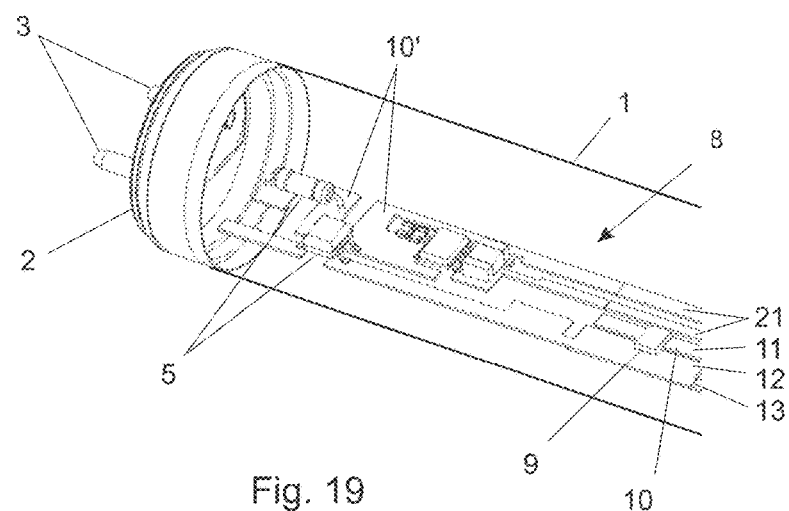
FIG. 19 schematically the first end region of a leadframe according to FIG. 17 with electronic components in a light fixture.
Figure 20:
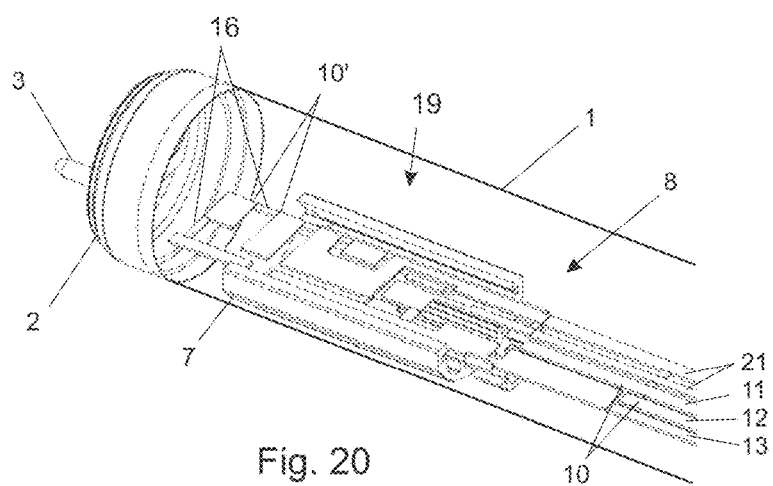
FIG. 20 shows schematically the first end region of a leadframe according to FIG. 17 without electronic components in a light fixture.

In FIG. 19 a detail of a light fixture is shown schematically with a leadframe 8 on which the electronic components 5 of the driver 4 are arranged directly. The arrangement according to FIG. 19 without the electronic components 5 of the driver 4 is illustrated in FIG. 20. For this purpose FIG. 20 shows how the leadframe 8 can be retained in a retaining bar 7 in the end region 19. FIG. 20 also shows the connection bars 16 which connect the sections 10, 10' of the leadframe 8 during the production.

Since the electronic components 5 of the driver 4 are usually arranged on the leadframe 8 before the leadframe is installed in the light fixture, FIG. 20 does not show a state which usually occurs during the production of the light fixture but serves merely for illustration.

Although the invention has been illustrated and described in greater detail by the depicted exemplary embodiments, the invention is not restricted thereto and other variations can be deduced therefrom by the person skilled in the art without departing from the scope of protection of the invention.

In general "a" or "an" may be understood as a single number or a majority, in particular in the context of "at least one" or "one or more" etc., provided that this is not explicitly precluded, for example by the expression "precisely one" etc.

Also, when a number is given this may encompass precisely the stated number and also a conventional tolerance range, provided that this is not explicitly ruled out.

If applicable, all individual features which are set out in the exemplary embodiments can be combined with one another and/or exchanged for one another, without departing from the scope of the invention.

LIST OF REFERENCES 1 tubular bulb
2 end cap
3 connecting pin
4 electronic driver
5 electronic components of the electronic driver
6 printed circuit board of the electronic driver
7 retaining bar
8 leadframe
9 LED
9' LED
10 section of the leadframe
10' section of the leadframe
11 first strip of the leadframe
12 second strip of the leadframe
13 third strip of the leadframe
14 U-shaped contact regions
15 sheet
16 connection bars
17 frame
18 central region of the leadframe
19 first end region of the leadframe
20 second end region of the leadframe
21 further strips of the leadframe
22 depressions
23 cable
24 stabilizing section 25 end face
26 contact clip
27 connection region of the contact clip
D diodes of the rectifier
C1 smoothing capacitor
C2 capacitor
R1 resistor
R2 resistor
IC integrated circuit

The invention claimed is:

1. A light fixture comprising:
a transparent tubular bulb;
at least one end cap arranged on an end of the tubular bulb;
a light engine arranged in the tubular bulb, the light engine having:
a leadframe configured as an electrically conductive structure that lacks an electrically insulating substrate or electrically insulating flexible layer, wherein the leadframe comprises a plurality of electrically conductive tracks formed from a material of the leadframe and situated so as to at least partially overlap in length adjacent one another; and
a plurality of semiconductor light elements arranged on the leadframe; and
an electronic driver electrically connected with the plurality of semiconductor light elements, the electronic driver comprising:
a first electronic component arranged on the leadframe; and
a second electronic component arranged on a printed circuit board electrically connected to the leadframe.

2. The light fixture according to claim 1, wherein the transparent tubular bulb is closed in a gas-tight manner and filled with a filling gas having a thermal conductivity ranging from 0.017 W/mK to 0.18 W/mK.

3. The light fixture according to claim 1, wherein the leadframe has a central region and at least one end region, wherein more than 50% of the plurality of semiconductor light elements are arranged on the central region, and wherein the first electronic component is arranged on the at least one end region.

4. The light fixture according to claim 3, wherein the leadframe has a width in the at least one end region and a width in the central region, wherein the width in the at least one end region is greater than the width in the central region.

5. The light fixture according to claim 1, wherein the leadframe has a width and a length, and the width is variable over the length.

6. The light fixture according to claim 1, wherein the transparent tubular bulb at least partially contains a filling material in which the electronic driver is at least partially embedded.

7. The light fixture according to claim 1, wherein:
the leadframe has a plurality of projections; and
an adhesive is disposed in the plurality of projections, wherein the leadframe is fastened to an inside surface of the transparent tubular bulb by the adhesive.

8. The light fixture according to claim 1, wherein the light engine has an electrically conductive section extending from and electrically connecting a first end of the leadframe or a printed circuit board arranged on the first end of the leadframe to a second end of the leadframe or a printed circuit board arranged on the second end of the leadframe.

9. The light fixture according to claim 8, wherein the electrically conductive section is a cable.

10. The light fixture according to claim 1, wherein the light engine has a plurality of stabilizing sections made from an insulating material, wherein the plurality of stabilizing sections are introduced locally into intermediate spaces of the leadframe fastening sections of the leadframe to one another, and wherein each stabilizing section lacks any electronic component populated thereon.

11. The light fixture according to claim 10, wherein the plurality of stabilizing sections is introduced locally in a punctiform or linear manner.

12. The light fixture according to claim 1, wherein at least one of:
the leadframe is configured as an elongate, substantially planar structure; and
the leadframe is situated on an inside surface of the transparent tubular bulb.

13. The light fixture according to claim 1, wherein the leadframe comprises:
a first strip configured to serve as a first electrically conductive track; and
a second strip configured to serve as a second electrically conductive track;
wherein:
the second strip is arranged substantially parallel to the first strip;
the first strip is divided into a plurality of physically separated segments;
the plurality of semiconductor light elements comprises:
a first semiconductor light element that is arranged on the second strip and a first segment of the first strip; and
a second semiconductor light element that is arranged on the second strip and a second segment of the first strip; and
the first semiconductor light element and the second semiconductor light element are electrically connected in parallel by the first strip and the second strip.

14. The light fixture according to claim 1, wherein the printed circuit board is electrically connected to the leadframe by at least one electrically conductive contact clip.

15. The light fixture according to claim 14, wherein the at least one electrically conductive contact clip electrically contacts a surface of the leadframe and curves around an end of the printed circuit board to electrically contact the printed circuit board.

16. The light fixture according to claim 1, wherein the printed circuit board is electrically connected to the leadframe by a bent section of the leadframe.

17. The light fixture according to claim 1, wherein the printed circuit board physically and electrically intervenes between the leadframe and the at least one end cap.

18. The light fixture according to claim 1, wherein the leadframe is configured as a substantially flat structure having a sheet thickness in the range of 0.1-2 mm.

19. The light fixture according to claim 1, wherein the leadframe and the transparent tubular bulb are of substantially similar coefficient of thermal expansion (CTE).

20. The light fixture according to claim 1, wherein the printed circuit board is arranged entirely within the transparent tubular bulb.

21. The light fixture according to claim 1, wherein the printed circuit board is partially arranged within the transparent tubular bulb and partially arranged within the at least one end cap.

22. The light fixture according to claim 1, wherein:
the first electronic component is arranged entirely in the tubular bulb; and
the second electronic component is partially arranged in the tubular bulb and partially arranged in the at least one end cap.

23. The light fixture according to claim 1, wherein:
the first electronic component is arranged entirely in the tubular bulb; and
the second electronic component is arranged entirely in the at least one end cap.

* * * * *